United States Patent [19]
Pikorz et al.

[11] Patent Number: 5,472,908
[45] Date of Patent: Dec. 5, 1995

[54] METHOD FOR MANUFACTURING A POWER SEMICONDUCTOR COMPONENT FOR HIGH SPEED CURRENT SWITCHING

[75] Inventors: Wolfgang Pikorz; Alois Sonntag, both of Warstein, Germany

[73] Assignee: Eupec Europaeische Gesellsch. F. Leitsungshalbleiter mbH & Co.KG, Warstein-Belecke, Germany

[21] Appl. No.: 263,376

[22] Filed: Jun. 21, 1994

[30] Foreign Application Priority Data

Jun. 21, 1993 [DE] Germany ............ 43 20 560.7

[51] Int. Cl.$^6$ ............................................. H01L 21/22
[52] U.S. Cl. .................... 437/150; 437/6; 148/DIG. 126
[58] Field of Search ............................. 437/6, 149, 150, 437/151, 152, 904, 946; 148/DIG. 126

[56] References Cited

U.S. PATENT DOCUMENTS

| | | | |
|---|---|---|---|
| 3,015,590 | 1/1962 | Fuller | 437/150 |
| 3,328,216 | 6/1967 | Brown | 437/152 |
| 3,941,672 | 3/1976 | Tanaka et al. | 437/946 |
| 3,954,534 | 5/1976 | Scifres et al. | 148/DIG. 97 |
| 4,638,552 | 6/1987 | Shimbo et al. | 437/946 |
| 4,920,062 | 4/1990 | Tsunoda | 437/6 |
| 4,960,731 | 10/1990 | Spitz et al. | 437/152 |

FOREIGN PATENT DOCUMENTS

| | | |
|---|---|---|
| 0190508 | 8/1986 | European Pat. Off. .. |
| 0190935 | 8/1986 | European Pat. Off. .. |
| 2317768 | 2/1977 | France . |
| 2543471 | 5/1976 | Germany . |
| 3815615 | 11/1989 | Germany . |
| 4133820 | 4/1993 | Germany . |

OTHER PUBLICATIONS

Astrova, Volle, Voronkov, Kozlov, Lebedev: "Ultrahigh Voltage Silicon pn–Junction with Breakdown Voltage above 20kV", Proceedings of ICED '88 Poiana Brasov, Romania Sep. 20–22, 1988, pp. A.1-2-1–A.1-2-4.

Abstract of Japan, Takeshi Sekiguchi, "Forming Method for Mesa Type Semiconductor Element", E–1289 Nov. 10, 1992, vol. 16/No. 539, 4–206640, pp. 233–235.

Abstract of Japan, Osamu Yamada, "Manufacture of Diode", E–1067 May 14, 1991, vol. 15/No. 187, 3–49232, pp. 183–185.

*Primary Examiner*—Chandra Chaudhari
*Attorney, Agent, or Firm*—Hill, Steadman & Simpson

[57] ABSTRACT

The destruction-free rapid dismantling of current of power semiconductor components can be substantially enhanced when the inhibiting pn-junction is produced with a polished surface of the semiconductor body. The pn-junction thus becomes so uniform that local overloads are avoided. As a result, the speed of the dismantling of the current of the power semiconductor can be increased.

11 Claims, 3 Drawing Sheets

METHOD FOR MANUFACTURING A POWER SEMICONDUCTOR COMPONENT FOR HIGH SPEED CURRENT SWITCHING

BACKGROUND OF THE INVENTION

1. Field of the Invention

The invention is directed generally to semiconductors and more specifically to a method for manufacturing a power semiconductor component having at least one planar surface and having a semiconductor body with at least two zones of different second conductivity types.

2. Description of the Related Art

Such power semiconductor components can, for example, be diodes or thyristors as well. Diodes are not only employed as uncontrolled rectifiers; rather, they are being increasingly utilized as free-running diodes or wiring diodes in converter circuits. In such circuits, they accept the current impressed by an inductive load in the turn-off phase. Since this current should be rapidly dismantled for the sake of a high switching speed, a high voltage arises at the inductive load and also at the diode. Since a high current flows at the same time, high losses occur at the diode. Also, the diode can be destroyed as a restlit thereof.

SUMMARY OF THE INVENTION

The object of the invention is to provide a power semiconductor component such that said loads can be increased without destroying the semiconductor component.

This object is achieved in a method for manufacturing a power semiconductor having a semiconductor body with a first conductivity type and at least one planar surface and at least two zones of the first or, respectively, a second conductivity type. The method having the steps of polishing a first surface of the semiconductor body at least one of its planar surfaces, and producing a zone of the second conductivity type proceeding from the polished first surface.

Crystal disruptions are inherently produced in the surfaces of power semiconductor components due to the standard processing methods of these surfaces such as grinding or lapping. The invention is based on the observation that when dopants are driven into the semiconductor body proceeding from such a disturbed surface, a non-uniform pn-junction arises. These inhomogeneities are the cause of the aforementioned overloads and outages of the diodes. It is also conceivable that they are similarly responsible for the destruction of thyristors that are narrowly dimensioned with respect to the thickness such as, for example, asymmetrical thyristors.

The invention shall be set forth with reference to a number of exemplary embodiments in combination with the figures.

DESCRIPTION OF THE PREFERRED EMBODIMENTS

Figure 1A:
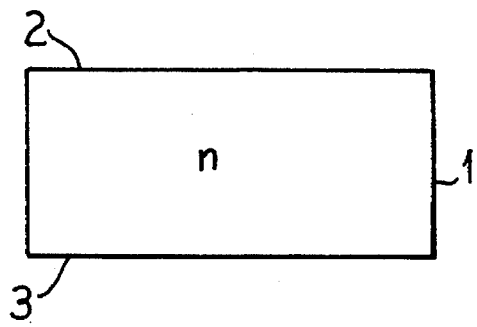
FIGS. 1a through 1e illustrate characteristic method steps of a first exemplary embodiment of the present invention.
Figure 1B:
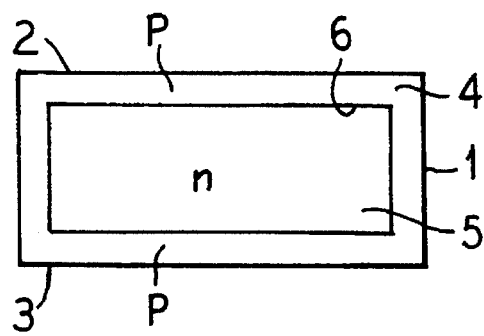
Figure 1C:
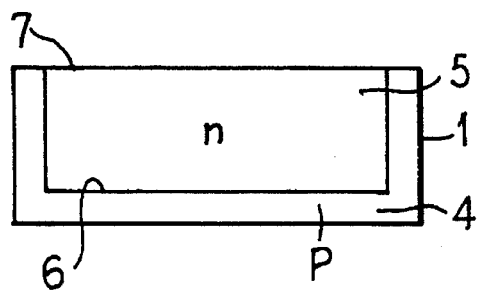
Figure 1D:
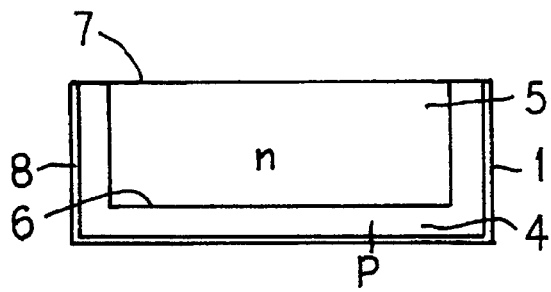
Figure 1E:
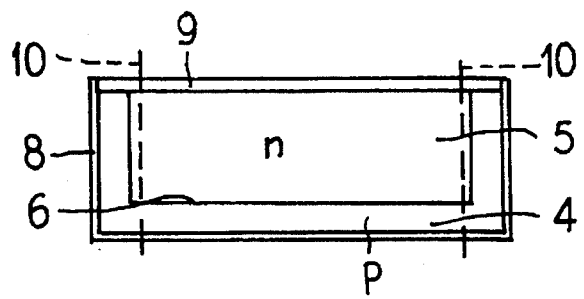

FIG. 1a illustrates an n-doped semiconductor body 1. It has an upper surface 2 and a lower surface 3. The surface 2 is processed in the standard way, for example, lapped and etched. The surface 3, by contrast, is polished. The technique for conducting such polishing is known from the manufacture of semiconductor wafers for integrated semiconductors. Such specular polishing, when employed in the present invention, leads to a mirrored surface having an average deviation of less than 0.1 µm. FIG. 1b illustrates the next step of the present invention wherein a p-doping substance, for example boron, is driven into the semiconductor body 1 from all sides. A p-doped zone 4 thereby arises and an n-doped zone 5 remains. A pn-junction 6 lies between these two zones. This pn-junction 6 is highly uniform and essentially free of any disturbances at the side neighboring the polished surface 3. In the next step of the invention shown in FIG. 1 c, the part of the p-doped zone 4 neighboring the surface 2 is removed, for example by grinding, lapping or etching. A surface 7 thereby results. After the remaining surface of the semiconductor body 1 has been provided with an oxide mask 8 as shown in FIG. 1e, n-doping material is driven into the surface 7. A highly n-doped ($n^+$-doped) zone 9 thereby results as shown in FIG. 1e, which essentially serves the purpose of contacting. As a last method step of the invention, the edge region of the p-doped zone 4 is mechanically and chemically removed along the broken lines 10. A mesa structure thereby results. Since the highly n-doped zone 9 was produced proceeding from the relatively highly disturbed surface 7, the $nn^+$-junction lying between the zones 5 and 9 is relatively inhomogeneous.

Alternatively, the surface 7 can be polished like the surface 3 after the grinding and etching. The $nn^+$-junction between the zones 5 and 9 then also becomes homogeneous and essentially disturbance-free.

Figure 2A:
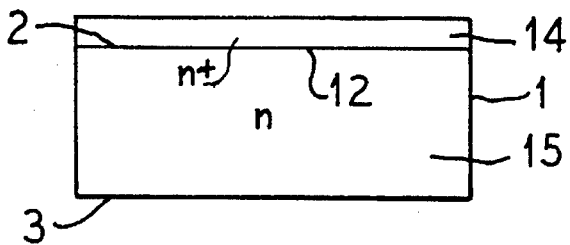
FIGS. 2a through 2c illustrate characteristic method steps of a second exemplary embodiment of the present invention.
Figure 2B:
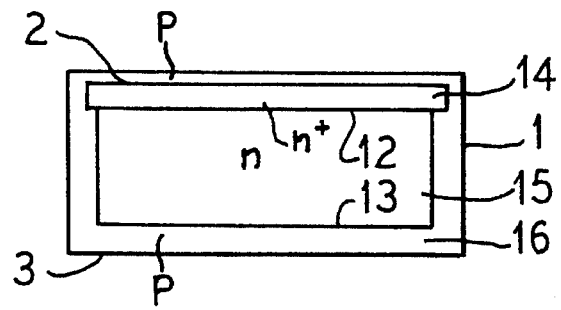
Figure 2C:
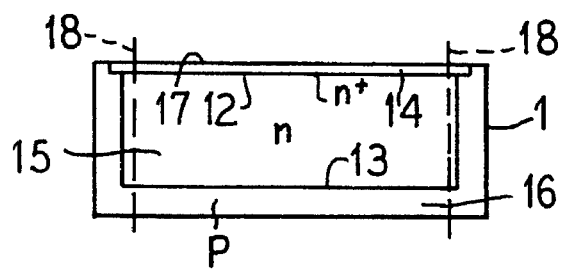

A second exemplary embodiment is illustrated in FIGS. 2a–2c and shows the n-doped semiconductor body 1. The upper surface 2 and the lower surface 3 are both polished in this embodiment. Subsequently, a highly n-doped epitaxial layer 14 is produced on the surface 2. In the next step illustrated in FIG. 2b, p-doping material is driven into the semiconductor body at all sides, including the zone 14. A p-doped zone 16 thereby results anti the zone 14 also diffuses somewhat into the zone 15 and into the p-doped layer 16. Next, that part of the p-zone 16 lying at the side of the epitaxial layer 14 is removed. A surface 17 thereby results. Subsequently, the edge region of the p-doped zone 16 is removed along the broken lines 18, so that a mesa structure having the zone sequence $n^+np$ again results as shown in FIG. 2c.

Figure 3A:
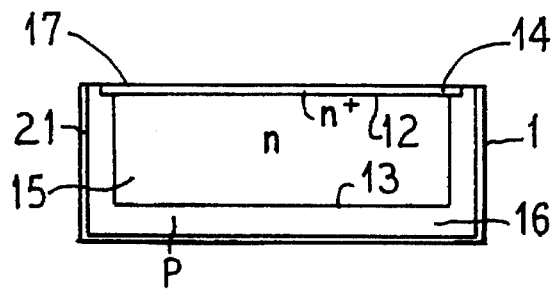
FIGS. 3a and 3b illustrate a development of the steps according to FIGS. 2a through 2c of the present invention.
Figure 3B:
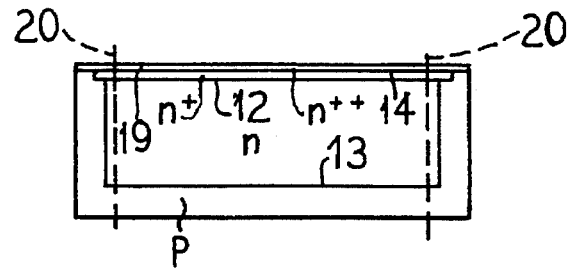

Instead of the separating along the broken lines 18, two further steps of the invention that are shown in FIGS. 3a and 3b can follow the step shown according to FIG. 2c. Thus, n-doping material can be driven into the surface 17, so that a highly n-doped zone 19 results that adjoins the n-doped layer 14. To that end, the semiconductor body is provided with an oxide mask 21 at both sides and at the underside. Subsequently, the semiconductor body 1 can be converted into a mesa structure by vertical incisions along the broken lines 20.

In the embodiments of FIGS. 2 and 3, an extremely uniform pn-junction as well as an extremely uniform $nn^+$-junction result.

Figure 4A:
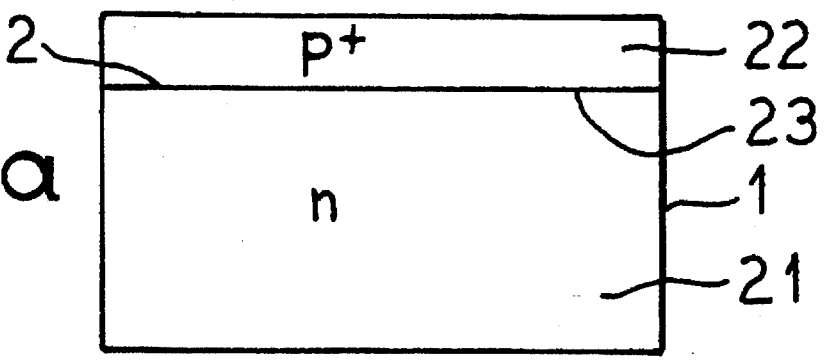
FIGS. 4a and 4b illustrate characteristic method steps according to a fourth exemplary embodiment of the present invention.
Figure 4B:
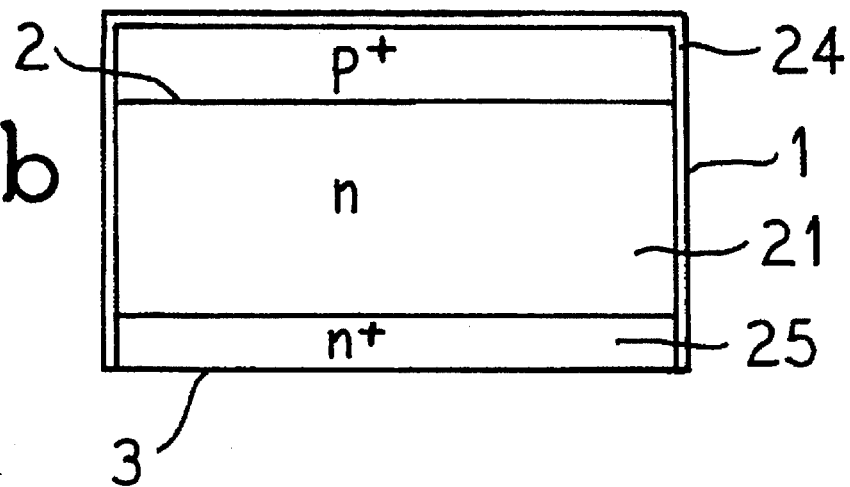

Instead of the n-doped epitaxial layer, a p-doped epitaxial layer 22 shown in FIG. 4a can alternatively be produced on the polished surface 2. The surface 2 thereby forms a pn-junction 23 between the epitaxial zone 22 and the zone 21 of the semiconductor body i which has remained unmodified. Highly n-doping material is subsequently driven into the surface 3. The edge region and the upper side of the semiconductor body 1 are thereby protected by an oxide mask 24. The surface 3 can thereby be either polished or lapped and etched, so that either a uniform, essentially undisturbed junction between the zones 21 and 25 is produced or a more non-uniform junction is produced. A non-uniform $nn^+$-junction is adequate for some applications. It is advantageous, however, to produce both junctions proceeding from a polished surface.

The inventors herein observed improved results in an exemplary embodiment of the present invention. For example, diodes having a diameter of 23ram and an off-state voltage $V_{RM}$ of 1700 V were dismantled at a rate of 1200 A/μs. In the testing conducted, 90% of the diodes withstood this dismantling without being destroyed.

Although the invention has been described with respect to preferred embodiments, it is not to be so limited as changes and modifications can be made therein which are within the full intended scope as defined by the appended claims.

We claim:

1. Method for manufacturing a power semiconductor component comprising the steps of:
   providing a semiconductor body of a first conductivity type and having at least one planar surface;
   polishing said at least one planar surface of said semiconductor body to produce a polished first surface with an average deviation of less than 0.1 μm; and
   producing a zone of a second conductivity type in said semiconductor body proceeding from said polished first surface and leaving a zone of said first conductivity type adjacent to said zone of said second conductivity type with a junction between said zones.

2. Method according to claim 1, wherein said step of producing a zone of said second conductivity type is further defined by producing said zone by epitaxial growth on said polished first surface of said semiconductor body.

3. Method according to claim 1, wherein said step of producing a zone of said second conductivity type is further defined by producing said zone by dopant drive-in proceeding from said polished first surface.

4. Method according to claim 1, further comprising; the steps of:
   polishing a second surface of said semiconductor body, which is a planar surface and producing a third zone by epitaxial growth proceeding from said polished second surface.

5. Method according to claim 4, wherein said step of producing a third zone is further defined by producing a third zone with said second conductivity type.

6. Method according to claim 4, wherein said step of producing a third zone is further defined by producing a third zone with said first conductivity type more highly doped than said semiconductor body.

7. Method according to claim 1, further comprising the steps of:
   polishing a second surface of said semiconductor body, which is a planar surface and producing a third zone by dopant drive-in proceeding from said polished second surface.

8. Method according to claim 7, wherein said step of producing a third zone is further defined by producing a third zone with said first conductivity type more highly doped than said semiconductor body.

9. Method according to claim 7, wherein said step of producing a third zone is further defined by producing a third zone with said second conductivity type.

10. Method according to claim 1, wherein said step of polishing said at least one planar surface of said semiconductor body to produce a polished first surface is further defined by specularly polishing said planar surface.

11. Method for manufacturing a power semiconductor component including an inner zone of a first conductivity type and being doped with a first doping concentration, a first outer zone of a second conductivity type adjoining the inner zone and being doped with a doping concentration greater than the first doping concentration, and a second outer zone adjoining the inner zone and being doped with a doping concentration greater than the first doping concentration, the method comprising the steps of:
   providing a semiconductor body having a first conductivity type and having at least one planar surface;
   polishing said at least one planar surface of said semiconductor body to produce a polished first surface with an average deviation of less than 0.1 μm; and
   producing the first outer zone proceeding from said polished first surface and leaving a zone of said first conductivity type adjacent to said first outer zone of said second conductivity type with a junction between said zones.

* * * * *